United States Patent [19]

Vladic

[11] 4,003,625

[45] Jan. 18, 1977

[54] ELECTRICAL CONNECTOR FOR DATA DISPLAY

[75] Inventor: Daniel Peter Vladic, Berwyn, Ill.

[73] Assignee: Bunker Ramo Corporation, Oak Brook, Ill.

[22] Filed: Apr. 18, 1975

[21] Appl. No.: 569,496

[52] U.S. Cl. ........................ 339/176 MP; 339/17 L

[51] Int. Cl.$^2$ .......................................... H05K 1/07

[58] Field of Search ............... 339/6 R, 17 C, 17 L, 339/17 LM, 17 M, 176 MF, 176 MP

[56] References Cited

UNITED STATES PATENTS

| | | | |
|---|---|---|---|
| 2,740,097 | 3/1956 | Edelman | 339/17 M |
| 3,008,113 | 11/1961 | Johnson | 339/176 MP |
| 3,601,746 | 8/1971 | Teagno | 339/176 MP |
| 3,706,954 | 12/1972 | Krafthefer | 339/17 L |
| 3,795,888 | 3/1974 | Nardo | 337/176 MP |

*Primary Examiner*—Roy Lake
*Assistant Examiner*—Mark S. Bicks
*Attorney, Agent, or Firm*—William Lohff; F. M. Arbuckle

[57] ABSTRACT

An electrical connector for a data display, for example a gas discharge glass data display, provides a low cost connection between the display and a printed circuit board. The connector is designed as an elongate device having an arcuate lower rear surface which allows infinite connector positions within 90° so that the contact tails of electrical contacts carried thereby can be bent to conform to a connector position which locates the data display at a desired angle with respect to a printed circuit board.

4 Claims, 4 Drawing Figures

ELECTRICAL CONNECTOR FOR DATA DISPLAY

BACKGROUND OF THE INVENTION

1. Field of the Invention

This invention relates to electrical connectors, and is more particularly concerned with an electrical connector for providing a low profile and low cost, adjustable connection between a printed circuit board and a data display.

2. Description of the Prior Art

The prior art has heretofore recognized a number of devices for mounting a data display at an angle with respect to a printed circuit board. In hand-held, compact calculators, for example, it is desirable to mount the digital data display at an angle with respect to a printed circuit board mounted generally centrally of the calculator so as to provide ease in reading the display. A variety of connectors for completing electrical connections between the display and the circuit board, and mounting the display at an angle with respect to the circuit board have been designed. These connectors take variety of forms including complex peripheral devices for engaging the edge of the circuit board and the data display and rotatable connectors with trunnion-type rotary mountings. These devices are generally complex and require long beam portions of the electrical contacts, and sometimes complex contact structures in order to ensure mechanical support and electrical contact to the data display.

Other connectors are merely in the form of angular adapters and reliance must be placed on associated structure for supporting the display at the angle defined by the adapter.

SUMMARY OF THE INVENTION

The primary object of the invention is to provide an electrical connector for a data display, and more particularly to provide, with such an electrical connector, a low cost connection between a printed circuit board and a data display.

Another object of the invention is to provide a low profile connection between a printed circuit board and a data display.

Still another object of the invention is to provide an adjustable connection between a printed circuit board and a data display, with the attendant object of providing such an adjustable connection without the necessity of movable parts.

Yet another object of the invention is to provide an electrical connector for a data display which has a built-in support which prevents the display from altering the contact gap of the connector which would result in a reduction of normal contact force.

BRIEF DESCRIPTION OF THE DRAWING

These and other objects, features and advantages of the invention, together with its organization, construction and operation will be best understood from the following detailed description of a preferred embodiment of the invention taken in conjunction with the accompanying drawing, on which.

DESCRIPTION OF THE PREFERRED EMBODIMENT

Figure 1:
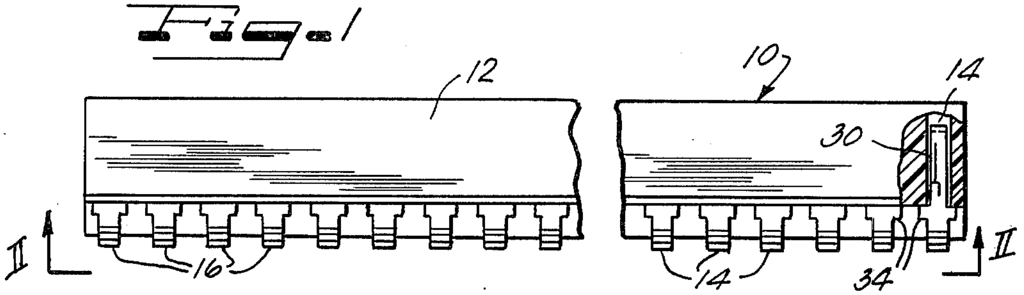
FIG. 1 is a top plan view of an electrical connector constructed in accordance with the principles of the present invention.
Figure 2:
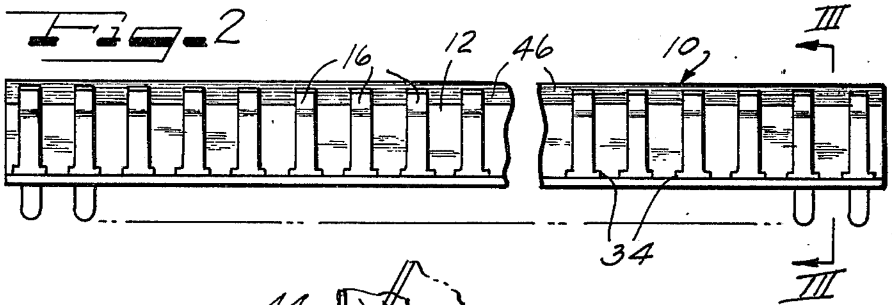
FIG. 2 is an elevational view of the electrical connector of FIG. 1, as viewed in the direction II—II.
Figure 3:
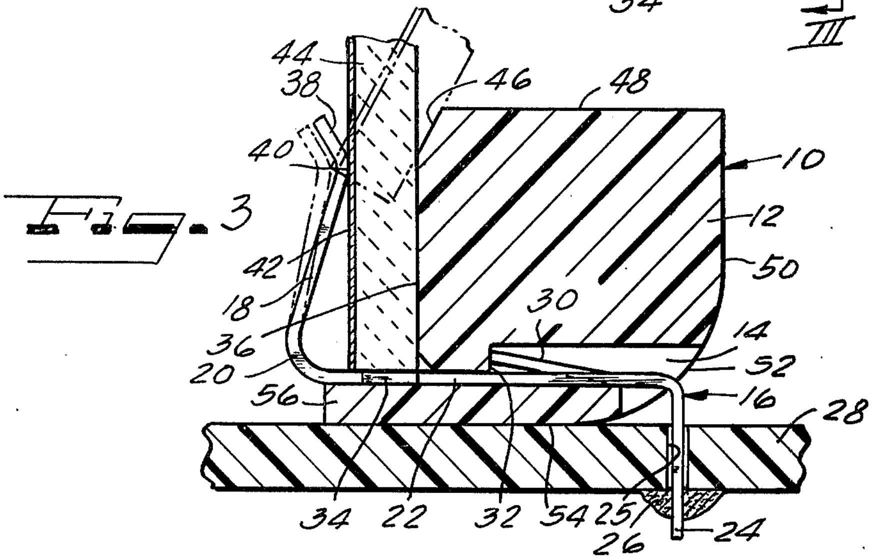
FIG. 3 is a sectional view of the apparatus of FIG. 2 taken generally along the line III—III and showing a data display supported by the electrical connector, and showing the electrical connector mounted on a printed circuit board.

Referring to FIGS. 1–3, an electrical connector is generally referenced 10 and is illustrated as comprising an insert 12 of dielectric material, for example a general purpose phenolic material.

The insert 12 comprises a plurality of generally parallel spaced-apart passageways 14 therethrough near the lower sides thereof. It should be pointed out that terms such as upper, lower, left and right as used herein are merely relative terms for the purpose of explaining the invention and are not necessarily limitations as to a particular orientation or disposition.

Each of the passageways 14 has an electrical contact 16 mounted therein. Each of the contacts 16 includes an active, resilient portion 18, a bowed portion 20, a straight portion 22, and a tail portion 24. As is particularly illustrated in FIG. 3, the tail portion 24 may be bent downwardly so as to extend through a mounting hole 25 in a mounting board 28 and be secured to the lower surface thereof by means of a bonding material 26. The mounting board 28 may be a printed circuit board carrying a plurality of circuits on the underside thereof and the bonding material 26 may advantageously be solder, provided by wave soldering, for example, for securing the tail 24 to the mounting board and electrically connecting the tail 24 to a circuit carried on the underside of the printed circuit board.

The contact 16 may be molded into the insert 12, in which case the passageway 14 completely embraces the contact. Other means of mounting the contacts may be employed, however, and one such arrangement for mounting the contacts is illustrated in FIG. 3 wherein the contacts 16 each include a tine 30 which engages a shoulder 32 within the passageway 14 to prevent movement of the contact toward the left. The contacts 16 each also include at least one laterally directed projection 34 for engaging a front surface 36 of the insert 12 and preventing the respective contact from moving toward the right, as illustrated in FIG. 3.

Each of the contacts 16 include a bent end portion 38 which is directed away from the insert 12 so as to form a circuit board contact portion 40 for engaging a conductor 42 carried on a data display 44, for example a gas discharge glass-type data display.

The insert 12 includes an upper surface 48 which is generally perpendicular to the surface 36 and connected thereto by way of a chamfer surface 46. As illustrated in FIG. 3, the relief offered by the chamfer surface 46 provides a low insertion force path of insertion for the data display. It should be also pointed out that the circuit board contact portions 40 of the contacts 16 are positioned below the lower edge of the chamfer surface 46 so that the contact portions 18 press the data display 44 against the surface 36 of the insert 12. It should be also pointed out that the insertion of the data display provides a wiping action of the contact portions 40 against their respective conductors 42 of the data display to provide good electrical contact.

The insert 12 also includes a rear surface 50 which is connected to a lower surface 54 by way of an arcuate surface 52. The tails 24 of the contacts 16 exit the insert 12 at a point between the surfaces 50 and 54. Inasmuch as the arcuate surface 52 is a relief of material of the insert in that area, the insert may be pivoted to any position between the position illustrated in FIG. 3 and a clockwise rotation of 90°, and such pivoting may occur without interference of a corner of the insert in the area of the tail 24, passageways 14 being provided with appropriate clearance in the area where the tail portions 24 of contacts 16 extend out of the insert.

Figure 4:
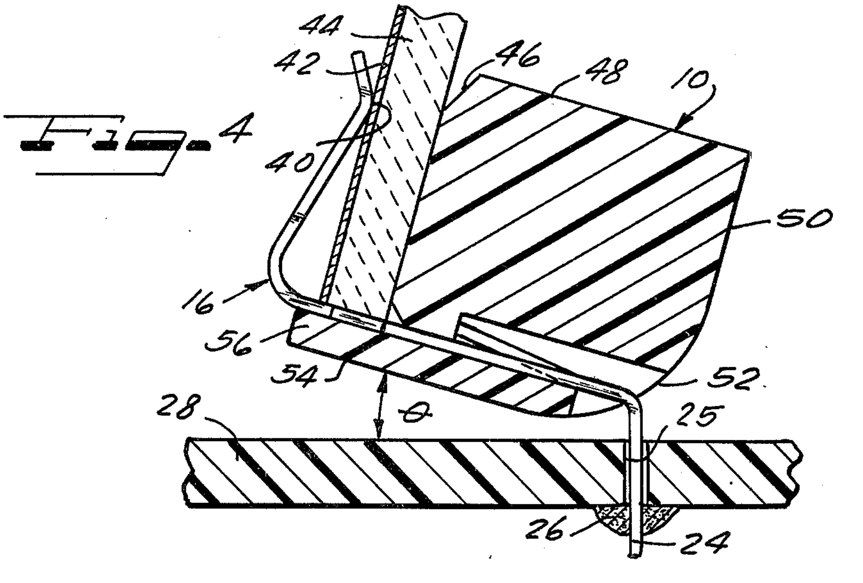
FIG. 4 is another sectional view, substantially the same as that illustrated in FIG. 3, showing the electrical connector rotated at an angle Θ to position the data display at a desired angle with respect to the printed circuit board.

If the pivoting of the insert occurs before soldering of the tail 24, the tail 24 is bent to the desired angle by the pivoting and the insert is in contact with the mounting board 28. If, however, mass production techniques are utilized, such as wave soldering, and the tail 24 is connected prior to rotation of the insert 12, the tail 24 is again bent to the desired angle and the insert 12 lifts and is carried above the upper surface of the mounting board 28, as illustrated in FIG. 4. In either case, the insert is positioned at a desired angle $\theta$ with respect to the upper surface of the mounting board 28. Also, in either case, and as is readily apparent from the drawing, the electrical connector of the present invention provides a low cost, low profile, adjustable connection for a data display to a mounting board, such as a printed circuit board.

A particularly important feature of the inventon resides in the provision of a projection or flange 56 which extends from the insert 12 forward of the surface 36 generally in contact with and coextensive with a section of each of the contacts 16. The flange 56 supports the contacts so that the same are not bent, resulting in a reduction of the normal contact force, during circuit board insertion. As illustrated in FIG. 3, flange 56 is positioned adjacent a section of contact 16 and opposite to the side adjoining the forward edge of the circuit board.

As is evident from the drawing, particularly FIGS. 3 and 4, a circuit board, such as a data display, may be positioned at a desired angle with respect to a mounting board and may be electrically connected to circuits carried by or adjacent the mounting board and supported by an electrical connector which is of simple structure which provides a low cost, low profile, adjustable connection between the display and the associated circuits.

The contacts 16 may be provided with the tail 24 extending directly rearward or bent to a particular angle, such as 90° downwardly. It is readily apparent that the desired angle of rotation $\theta$ may be easily provided with the structure disclosed herein without the necessity of provision of a plurality of moving parts, sliding contacts or the like.

Although I have described my invention by reference to a particular illustrative embodiment thereof, many changes and modifications of the invention may become apparent to those skilled in the art without departing from the spirit and scope of my invention. I therefore intend to include within the patent warranted hereon all such changes and modifications as many reasonably and properly be included within the scope of my contribution to the art.

I claim:

1. An electrical connector for receiving and mounting a circuit board at an angle with respect to a mounting board having mounting holes therein, said connector comprising: an elongate connector insert of dielectric material having a plurality of passageways extending transversely therethrough and spaced along said insert;

a plurality of electrical contacts mounted in respective ones of said passageways, each of said contacts including a first end portion extending from said insert to be received in and secured at a respective mounting board hole, and a resilient second portion extending from said insert and directed to clampingly engage and press a circuit board against a side of said insert generally perpendicular to the longitudinal direction of said passageways, said second portion including a circuit board contact portion for electrically contacting a circuit on the circuit board;

said insert including support means coextensive with a section of said second portion to prevent bending of said second portion during insertion of a circuit board; and means on said insert permitting bending of said contact first portions and pivoting of said insert to a predetermined angle with respect to the mounting board after securement of said contact first portions to place the circuit board in a desired position.

2. The electrical connector according to claim 1, wherein said insert has a second side generally parallel to said first mentioned side, a third side extending between said first and second sides, and an arcuate surface extending between said second and third sides to permit pivoting of said insert.

3. The electrical connector of claim 1, wherein each of said passageways includes a shoulder therein; and each of said electrical contacts includes a tine for engaging said shoulder of the respective passageway and at least one lateral projection for engaging the exterior of said insert to prevent movement of the contact in either direction.

4. An electrical connector for receiving and mounting a circuit board at an angle with respect to a mounting board having mounting holes therein, the circuit board including a forward edge, said connector comprising:

an elongate connector insert of dielectric material having a plurality of passageways extending transversely therethrough and spaced along said insert, said passgeways extending through a side of said insert which is generally perpendicular to the longitudinal direction of said passageways, a plurality of electrical contacts mounted in respective ones of said passageways, each of said contacts including a first end portion extending from said insert to be received in and secured at a respective mounting hole, and a resilient second portion extending from said insert and directed in opposed relation to said side of said insert to clampingly engage and press a circuit board against said side of said insert, said second portion including a circuit board contact portion for electrically contacting a circuit on the circuit board, said insert including support means extending adjacent to and in supporting relation with said second portions of said contacts on the opposite side thereof from the position occupied by the edge of a circuit board when engaged as hereinabove described, said passageways at the ends thereof where said first portions of said contacts extend from said insert being sized to provide clearance around said first portions, permitting bending of said first portions and corresponding orientation of said insert to a predetermined angle with respect to the mounting board.

* * * * *